United States Patent [19]

Zuffada et al.

[11] Patent Number: 4,935,796
[45] Date of Patent: Jun. 19, 1990

[54] DEVICE FOR MINIMIZING PARASITIC JUNCTION CAPACITANCES IN AN INSULATED COLLECTOR VERTICAL P-N-P TRANSISTOR

[75] Inventors: Maurizio Zuffada, Milan; Fabrizio Sacchi, Gambarana; Paolo Ferrari, Gallarate, all of Italy

[73] Assignee: SGS-Thomson Microelectronics S. R. L., Milan, Italy

[21] Appl. No.: 154,491

[22] Filed: Feb. 8, 1988

Related U.S. Application Data

[63] Continuation of Ser. No. 882,295, Jul. 7, 1986, abandoned.

[30] Foreign Application Priority Data

Nov. 20, 1985 [IT] Italy .................................. 22913 A/85

[51] Int. Cl.$^5$ ............................................ H01L 29/72
[52] U.S. Cl. ........................................ 357/34; 357/40; 357/42; 357/51; 307/246; 307/254; 307/296.2; 307/355; 307/491; 330/85; 330/307
[58] Field of Search ........................ 357/34, 48, 51, 40; 307/254, 355, 246, 296 R, 491; 330/85, 307

[56] References Cited

U.S. PATENT DOCUMENTS

| | | | |
|---|---|---|---|
| 3,089,098 | 5/1963 | Noe | 330/85 |
| 3,379,987 | 4/1968 | Volkers | 330/156 |
| 3,860,836 | 1/1975 | Pedersen | 357/40 |
| 3,906,390 | 9/1975 | Rollett | 330/107 |
| 4,038,680 | 7/1977 | Yagi et al. | 357/40 |
| 4,302,726 | 11/1981 | Shobbrook | 307/296 R |
| 4,323,798 | 4/1982 | Watkins | 330/107 |
| 4,494,014 | 1/1985 | Pelletier et al. | 307/254 |
| 4,588,904 | 5/1986 | Glogolja | 307/254 |
| 4,607,231 | 8/1986 | Nakayama | 330/107 |

OTHER PUBLICATIONS

"A Vertically Isolated Self-Aligned Transistor-VIST", by Takemoto et al., IEEE Transactions on Electron Devices, vol. ED-29, No. 11, Nov. 1982, pp. 1761–1765.
Collins Italian-English & English-Italian Dictionary front cover & pp. 91, 286, 288.
American Heritage Dictionary, Second College Edition, front cover & pp. 667, 680.
"Method For Fabricating a Self Aligned Vertical PNP Transistor", by Isaac et al.
IBM Technical Disclosure Bulletin, vol. 22, No. 8A, Jan. 1980, pp. 3393–3396.
"Integrated Electronics: Analog and Digital Circuits and Systems", by Millman et al., Cover Page and pp. 198–201.
"High-Impedance Electronics" by Purves, Wireless World, Mar. 1983, pp. 31, 32.

Primary Examiner—Joseph E. Clawson, Jr.
Attorney, Agent, or Firm—Jones, Askew & Lunsford

[57] ABSTRACT

A device for minimizing parasitic junction capacitances in an isolated collector vertical PNP transistor, having a terminal N connected to an epitaxial n layer, comprises a bootstrap circuit including an emitter follower vertical PNP transistor having its emitter and base respectively connected to the terminal of the epitaxial n layer and the collector of the isolated collector transistor; further, a bias resistance is connected between the emitter and one pole of a voltage supply to the emitter follower.

6 Claims, 1 Drawing Sheet

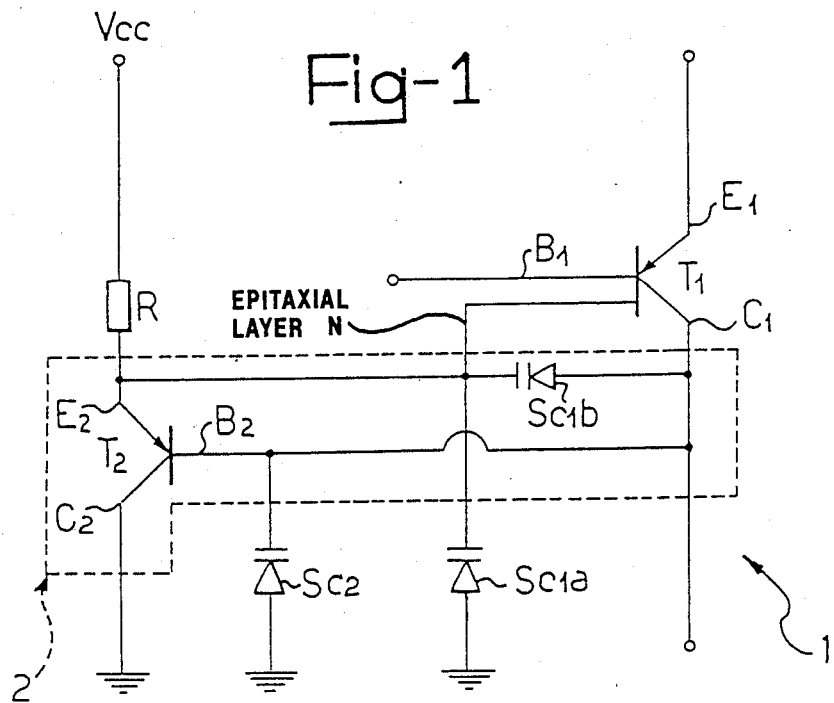
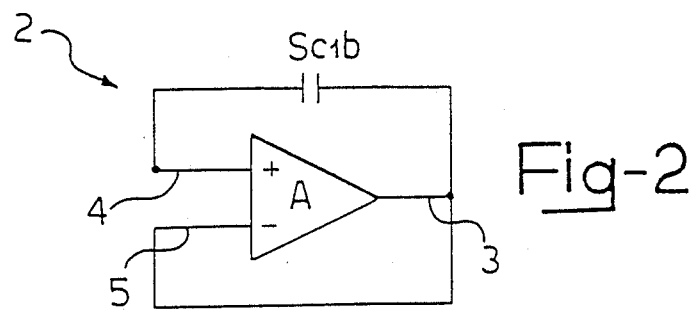

DEVICE FOR MINIMIZING PARASITIC JUNCTION CAPACITANCES IN AN INSULATED COLLECTOR VERTICAL P-N-P TRANSISTOR

This application is a continuation, of application Ser. No. 882,295, filed July 7, 1986 now abandoned.

DESCRIPTION

This invention relates to a device for minimizing parasitic junction capacitances in an isolated collector, vertical PNP transistor of the type which comprises a terminal connected to an n epitaxial layer of the transistor.

As is well-known in the art, PNP transistors would find widespread application to wide band amplifiers if such transistors had good frequency response characteristics.

Recently developed technologies have presently provided isolated collector vertical PNP transistors which represent a noteworthy step forward in that direction. However, a high overall junction parasitic capacitance, as seen from the collector toward ground, constitutes a serious limiting factor to the use of isolated vertical PNP's; in fact, due to deterioration of the frequency characteristics, the versatility of these transistors—potentially suitable for use in quite a large number of circuit configurations—decreases accordingly.

The junction parasitic capacitances of isolated collector vertical PNP transistors, as seen from the collector toward ground, are basically of two types:

a first SC1a between the p+ isolation layer and the epitaxial layer n; and a second SC1b between the p+ doped layer of the collector, the epitaxial layer n, and the buried layer n+.

Due to intensive doping and the large junction surface area of this type transistor, the values of these capacitances are fairly high, approximately 6 pF at 0 Volt for the capacitance SC1a, and approximately 7 pF for the capacitance SC1b, also at 0 Volt.

In order to minimize such parasitic capacitances, the most straightforward approach would appear to be that of leaving the transistor terminal connected to the epitaxial layer n disconnected. In fact, with that provision, the two capacitances, as seen from the collector to ground, would be in series to each other, giving an equivalent parasitic capacitance of about 3.2 pF.

However, this approach is not practicable because, for the transistor to operate properly, it is required that the epitaxial layer n be biased at a predetermined voltage which is compatible with the transistor breakdown levels.

According to prior techniques, however, another two courses are instead generally followed, namely:

low-impedance biasing of the epitaxial layer n to actually nullify the effect of SC1a, while leaving unaltered SC1b=7 pF; and connecting the terminal of the epitaxial layer n to the transistor collector, thus shorting out the parasitic capacitance SC1b, but still with SC1a=6 pF.

Both of these approaches result in decreased overall value of the parasitic junction capacitances, but that decrease is quite inadequate to meet the above-outlined requirements.

In problem underlying this invention is that of achieving minimization of the parasitic junction capacitances in an isolated collector, vertical PNP transistor by means of a device having such operational and constructional features as to overcome the above-mentioned prior drawbacks.

This problem is solved according to the invention by a device as indicated, characterized in that it includes a so-called bootstrap type circuit connected to the terminal of the epitaxial layer n and to the transistor collector. Advantageously, said bootstrap circuit comprises an emitter follower transistor having its emitter and base terminals respectively connected to the terminal of the epitaxial layer and the collector of the isolated collector transistor, a bias resistance being connected between one pole of a voltage supply and the emitter terminal of said emitter follower.

According to a further aspect of the invention, the emitter follower is a vertical PNP transistor.

Further features and advantages of the inventive device will be more clearly apparent from the following description of a preferred embodiment thereof, given herein below by way of example and not of limitation with reference to the accompanying drawings.

In the drawings:

FIG. 1 shows diagramatically a device according to the invention; and

FIG. 2 shows an equivalent circuit of a detail of FIG. 1.

With reference to the drawing figures, a device 1 according to this invention comprises an isolated collector vertical PNP transistor, known per se and generally indicated at T1.

The transistor T1 comprises an emitter terminal E1 connected to a p-doped region of its structure, not shown in the drawing, a base terminal B1 connected to an n+ region, and a collector terminal C1 connected to a p+ region.

Furthermore, the transistor T1 is provided with a terminal N connected to an epitaxial layer n of the transistor T1. The transistor T1 comprises, therefore, a first parasitic junction capacitance SC1a between an isolation p+ region and the epitaxial layer n, which is connected to ground and the terminal N, and a second parasitic junction capacitance SC1b between the p+ region of the collector C1 and the epitaxial layer n, including also a parasitic junction capacitance to an n+ buried layer between the collector terminal C1 and the terminal N.

The device 1 further comprises an emitter follower vertical PNP transistor T2, having emitter E2 and base B2 terminals respectively connected to the terminal N of the epitaxial layer n and the collector terminal C1 of the transistor T1. The transistor T2 also has a grounded collector terminal C2, whilst an overall parasitic junction capacitance SC2 of the emitter follower transistor T2 is connected to ground and the base terminal B2.

Furthermore, a bias resistance R is connected between the emitter terminal E2 and one pole VCC of a voltage supply to the emitter follower T2.

The device according to the invention operates in the following manner.

In view of the above-described mode of connecting the PNP transistors T1 and T2, it may be seen that the base B2-emitter E2 junction holds the collector C1-epitaxial layer n junction reverse biased in the transistor T1.

Furthermore, from examination of the detail indicated at 2 in FIG. 1, which comprises essentially the emitter follower T2 and the parasitic capacitance SC1b, it is seen (FIG. 2) how that detail may be equated operation-wise to a circuit 2, known as a bootstrap circuit, which consists of an operational amplifier A, being the equivalent of the emitter follower T2 and having an output 3 connected to both a positive input pole 4 and negative input pole 5 to the amplifier A, with the parasitic capacitance SC1b connected between the output 3 and the positive input pole 4 of the amplifier A.

Consequently, with a voltage gain A of the emitter follower approximating a unit value, the effect of the parasitic capacitance SC1b is thus eliminated.

As for the parasitic capacitance SC1a, in the device 1 of this invention it is connected to the emitter terminal E2 of the emitter follower T2, and accordingly, it is seen from the base terminal B2 toward ground as a capacitance equal in value to the capacitance SC1a divided by a factor $\beta_2$ of current amplification, typical of transistors, which with a vertical PNP would be $\beta \geq 60$.

Thus, the collector terminal C1 of the transistor T1, owing to its being connected to the base terminal B2 of the emitter follower T2, sees toward ground a parasitic capacitance SC1a divided by the factor $\beta_2$, whereto the overall junction parasitic capacitance SC2 of the emitter follower T2 is, however, to be added.

That parasitic capacitance SC2 has, however, a very low value thanks to a vertical PNP transistor such as the emitter follower T2 having a very small junction surface area and no buried layer n+.

With the inventive device, the performance of the vertical PNP transistors with isolated collector is greatly improved; in fact, the parasitic junction capacitances as seen from the collector toward ground are surprisingly reduced by at least 80% over the best-case prior approach.

Furthermore, thanks to the apparently simple construction, such a device can fully meet the demand for versatility and high performance in isolated collector vertical PNP transistors.

We claim:

1. For use with an isolated collector vertical PNP transistor having an emitter terminal, a base terminal, a non-grounded collector terminal, an epitaxial layer, and a p+ region connected to a circuit ground, an apparatus for minimizing effects of a first parasitic junction capacitance between said p+ region and said epitaxial layer, and a second parasitic junction capacitance between said collector and said epitaxial layer, said apparatus comprising:
   a second PNP transistor having an emitter terminal and a base terminal connected respectively to said epitaxial layer of said isolated collector vertical PNP transistor and to said collector of said isolated collector vertical PNP transistor, and a collector connected to said circuit ground, thereby substantially eliminating effects of said first and second parasitic junction capacitances.

2. For use with an isolated collector vertical PNP transistor having an emitter terminal, a base terminal, a non-grounded collector terminal, an epitaxial layer, and a p+ region connected to a circuit ground, an apparatus for minimizing effects of a parasitic junction capacitance between said p+ region and said epitaxial layer, said apparatus comprising:
   a second PNP transistor having an emitter terminal and a base terminal connected respectively to said epitaxial layer of said isolated collector vertical PNP transistor and to said collector of said isolated collector vertical PNP transistor, and a collector connected to said circuit ground, thereby substantially eliminating effects of said parasitic junction capacitance.

3. An apparatus according to claim 2 further comprising a bias resistor connected between one pole of a voltage supply and said emitter terminal of said second PNP transistor.

4. For use with an isolated collector vertical PNP transistor having an emitter terminal, a base terminal, a non-grounded collector terminal, an epitaxial layer, and a p+ region connected to a circuit groun, an apparatus for minimizing effects of a parasitic junction capacitance between said collector and said epitaxial layer, said apparatus comprising:
   a second PNP transistor having an emitter terminal and a base terminal connected respectively to said epitaxial layer of said isolated collector vertical PNP transistor and to said collector of said isolated collector vertical PNP transistor, and a collector connected to said circuit ground, thereby substantially eliminating effects of said parasitic junction capacitance.

5. An apparatus according to claim 4 further comprising a bias resistor connected between one pole of a voltage supply and said emitter terminal of said second PNP transistor.

6. An apparatus according to claim 1 further comprising a bias resistor connected between one pole of a voltage supply and said emitter terminal of said second PNP transistor.

* * * * *